(12) United States Patent
Wallner et al.

(10) Patent No.: US 9,887,135 B1
(45) Date of Patent: Feb. 6, 2018

(54) METHODS FOR PROVIDING VARIABLE FEATURE WIDTHS IN A SELF-ALIGNED SPACER-MASK PATTERNING PROCESS

(71) Applicant: GLOBALFOUNDRIES Inc., Grand Cayman (KY)

(72) Inventors: Jin Wallner, Albany, NY (US); Haoren Zhuang, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/581,510

(22) Filed: Apr. 28, 2017

(51) Int. Cl.
| | |
|---|---|
| *H01L 21/033* | (2006.01) |
| *H01L 21/8234* | (2006.01) |
| *H01L 21/3213* | (2006.01) |
| *H01L 29/66* | (2006.01) |
| *H01L 21/3115* | (2006.01) |
| *G03F 7/00* | (2006.01) |
| *H01L 21/308* | (2006.01) |

(52) U.S. Cl.
CPC .... *H01L 21/823437* (2013.01); *G03F 7/0002* (2013.01); *H01L 21/0332* (2013.01); *H01L 21/0337* (2013.01); *H01L 21/0338* (2013.01); *H01L 21/3081* (2013.01); *H01L 21/3086* (2013.01); *H01L 21/3088* (2013.01); *H01L 21/31155* (2013.01); *H01L 21/32139* (2013.01); *H01L 29/6653* (2013.01); *H01L 29/6656* (2013.01)

(58) Field of Classification Search
CPC ............. H01L 21/0337; H01L 21/0338; H01L 21/0332; H01L 21/3086; H01L 21/3088; H01L 21/3081; H01L 21/31155; H01L 21/31144; H01L 21/32139; H01L 21/823437; H01L 29/6653; H01L 29/6656; G03F 7/0002
See application file for complete search history.

(56) References Cited

U.S. PATENT DOCUMENTS

| | | | |
|---|---|---|---|
| 5,783,494 A | 7/1998 | Sakurai et al. | |
| 7,709,396 B2 | 5/2010 | Bencher et al. | |
| 7,811,840 B2 * | 10/2010 | Sandhu | H01L 45/00 257/103 |
| 8,124,534 B2 | 2/2012 | Wallner et al. | |
| 8,853,085 B1 | 10/2014 | Abdallah et al. | |
| 8,859,433 B2 | 10/2014 | Abdallah et al. | |
| 8,900,887 B2 | 12/2014 | Tang et al. | |

(Continued)

*Primary Examiner* — Michael Trinh
(74) *Attorney, Agent, or Firm* — Amerson Law Firm, PLLC

(57) ABSTRACT

A method includes forming a first mandrel layer above a first process layer. A first implant region is formed in the first mandrel layer. The first mandrel layer is patterned to define a plurality of first mandrel elements. At least a first subset of the first mandrel elements is formed from the first mandrel layer outside the first implant region and a second subset of the first mandrel elements is formed from the first implant region. First spacers are formed on sidewalls of the plurality of first mandrel elements. The first subset of the first mandrel elements are selectively removed without removing the second subset of the first mandrel elements. The first process layer is patterned using the first spacers and the second subset of the first mandrel elements as an etch mask.

20 Claims, 13 Drawing Sheets

(56) References Cited

U.S. PATENT DOCUMENTS

| | | | |
|---|---|---|---|
| 9,214,360 B2* | 12/2015 | Jang | H01L 21/28141 |
| 9,508,562 B2 | 11/2016 | Xu et al. | |
| 9,576,817 B1* | 2/2017 | Cheng | H01L 21/31144 |
| 9,620,380 B1* | 4/2017 | Dai | H01L 29/6656 |
| 9,691,615 B2* | 6/2017 | Brink | H01L 21/76832 |
| 2006/0068596 A1* | 3/2006 | Dobuzinsky | H01L 21/3081 |
| | | | 438/740 |
| 2013/0284699 A1 | 10/2013 | Ogihara et al. | |
| 2014/0287587 A1* | 9/2014 | Lee | B81C 1/00031 |
| | | | 438/694 |
| 2014/0346142 A1 | 11/2014 | Chapuis et al. | |
| 2015/0151329 A1 | 6/2015 | Kawanishi et al. | |
| 2015/0235839 A1 | 8/2015 | Coskun et al. | |

\* cited by examiner

METHODS FOR PROVIDING VARIABLE FEATURE WIDTHS IN A SELF-ALIGNED SPACER-MASK PATTERNING PROCESS

BACKGROUND OF THE INVENTION

1. Field of the Invention

The disclosed subject matter relates generally to the fabrication of semiconductor devices and, more particularly, to methods for providing variable feature widths in a self-aligned spacer-mask patterning process.

2. Description of the Related Art

In modern integrated circuits, minimum feature sizes, such as the channel length of field effect transistors as defined by the critical dimension (CD) of the gate electrode, have reached the deep sub-micron range, thereby steadily increasing performance of these circuits in terms of speed and/or power consumption and/or diversity of circuit functions. Existing optical lithography is capable of high-throughput processing, but the patterning pitch of a single optical lithography step is limited. A challenge for lithography is to devise tools, materials and processes that can reliably, efficiently and quickly pattern structures with smaller dimensions, reduced pitch or varied pitches.

The CD of the gate electrodes, which also defines the channel length, is typically limited by the photolithography processes employed. To improve the reliability of the patterning process, a large number of evenly spaced lines are typically formed in a regular pattern. The width of each line and the pitch between lines is determined by the patterning process. In an exemplary self-aligned technique, referred to as self-aligned double patterning (SADP), a hard mask layer is formed above a gate electrode material layer and a plurality of mandrel line elements is formed above the hard mask layer. Spacers are formed on sidewalls of the mandrel and the mandrel is removed, leaving the spacers as an etch mask for patterning the hard mask layer. The pitch of the spacers is effectively double that of the mandrel elements. Another technique, referred to as self-aligned quadruple patterning (SAQP), forms another set of spacers and removes the first set, effectively quadrupling the pitch of the mandrel elements. The patterned hard mask layer is used to etch the underlying gate electrode material layer.

In some devices, arrays of narrow gate electrodes are bounded by wider lines of gate electrode material to provide mechanical stability to the pattern for various processing steps, such as planarization and cleaning. Due to the regular nature of the spacers and the self-aligned process, it is inherently difficult to pattern lines with widths greater than the characteristic width of the patterning process, referred to as the 1× width. The patterning of wider lines, such as those needed for high current capacity power rails, typically requires additional masking and patterning steps, giving rise to increased fabrication complexity and cost. Due to the use of multiple patterning technologies, defects may also increase, such as overlay errors, pitch walking, hard mask profile defects, etc.

The present application is directed to eliminating or reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods for providing variable feature widths in a self-aligned spacer-mask patterning process. One illustrative method includes, among other things, forming a first mandrel layer above a first process layer. A first implant region is formed in the first mandrel layer. The first mandrel layer is patterned to define a plurality of first mandrel elements. At least a first subset of the first mandrel elements is formed from the first mandrel layer outside the first implant region and a second subset of the first mandrel elements is formed from the first implant region. First spacers are formed on sidewalls of the plurality of first mandrel elements. The first subset of the first mandrel elements are selectively removed without removing the second subset of the first mandrel elements. The first process layer is patterned using the first spacers and the second subset of the first mandrel elements as an etch mask.

Another illustrative method includes, among other things, forming a lower mandrel layer above a process layer. A lower implant region is formed in the lower mandrel layer. An upper mandrel layer is formed above the lower mandrel layer. An upper implant region is formed in the upper mandrel layer. The upper mandrel layer is patterned to define a plurality of first mandrel elements. At least a first subset of the first mandrel elements is formed from the upper mandrel layer outside the upper implant region and a second subset of the upper mandrel elements is formed from the upper implant region. First spacers are formed on sidewalls of the plurality of upper mandrel elements. The first subset of the upper mandrel elements is selectively removed without removing the second subset of the upper mandrel elements. The lower mandrel layer is patterned using the first spacers and the second subset of the upper mandrel elements as an etch mask to define a plurality of lower mandrel elements. At least a first subset of the lower mandrel elements is formed from the lower mandrel layer outside the lower implant region and a second subset of the lower mandrel elements is formed from the lower implant region. Second spacers are formed on sidewalls of the plurality of lower mandrel elements. The first subset of the lower mandrel elements is selectively removed without removing the second subset of the lower mandrel elements. The process layer is patterned using the second spacers and the second subset of the lower mandrel elements as an etch mask.

BRIEF DESCRIPTION OF THE DRAWINGS

The disclosure may be understood by reference to the following description taken in conjunction with the accompanying drawings, in which like reference numerals identify like elements, and in which.

Figure 1A:
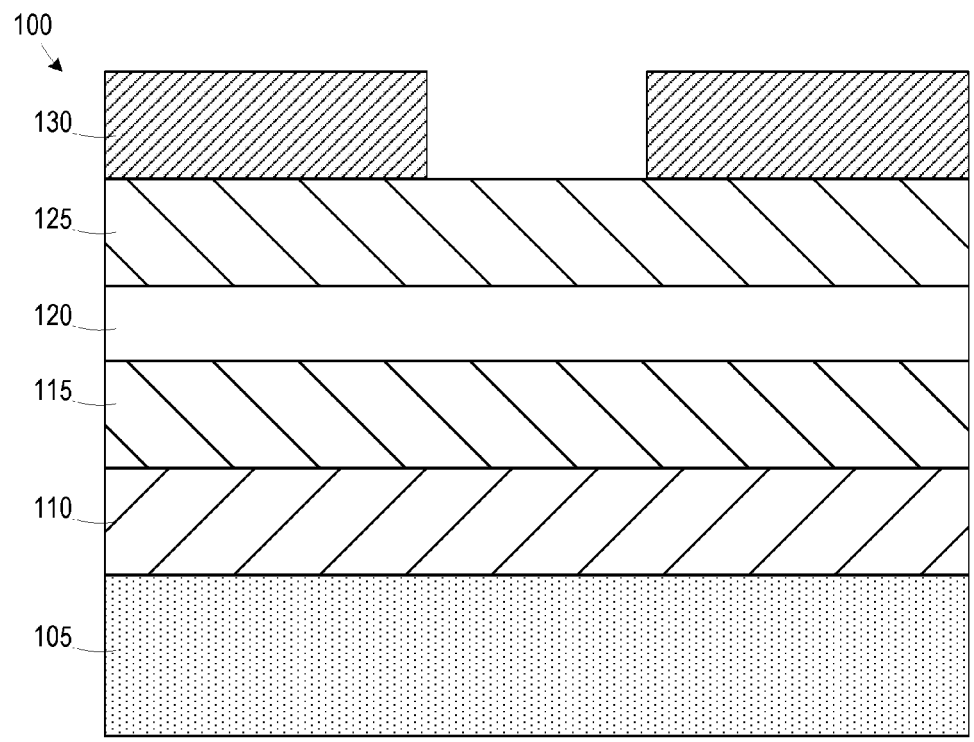
FIGS. 1A-1H are cross-sectional diagrams illustrating patterning of a process layer using a sidewall image template with a modified mandrel.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods for providing variable feature widths in a self-aligned spacer-mask patterning process. With reference to the attached drawings various illustrative embodiments of the methods and devices disclosed herein will now be described in more detail.

FIGS. 1A-1H are cross-sectional diagrams illustrating a method for forming a semiconductor device 100 by patterning a process layer using a sidewall image template with a modified mandrel. FIG. 1A illustrates the device 100 including a substrate 105, an isolation structure 110 (e.g., silicon dioxide), a gate material layer 115 (e.g., amorphous silicon), a first hard mask layer 120 (e.g., silicon nitride), a mandrel layer 125 and a patterned mask layer 130 (e.g., a stack including organic patterning layer, anti-reflective coating layer, photoresist layer, etc.). Although the example illustrates the patterning of a gate material layer 115, other layers may be patterned, such as a mandrel layer, an insulating material layer, etc. The substrate 105 may have a variety of configurations, such as the depicted bulk silicon configuration. The substrate 105 may also have a silicon-on-insulator (SOI) configuration that includes a bulk silicon layer, a buried insulation layer and an active layer, wherein semiconductor devices are formed in and above the active layer. The substrate 105 may be formed of silicon or silicon germanium or it may be made of materials other than silicon, such as germanium. Thus, the terms "substrate" or "semiconductor substrate" should be understood to cover all semiconducting materials and all forms of such materials. The substrate 105 may have different layers.

The device 100 may include transistor devices, such as finFET transistor devices above which gate electrodes may be patterned from the gate material layer 115. Typically, the isolation structure 110 is formed above a plurality of fins (not shown) and recessed to expose upper fin portions while remaining in the trenches between the fins to provide isolation therebetween. For ease of illustration, the stack of layers 105-130 is illustrated in a region outside the fins (e.g., gate over STI region).

Figure 1B:
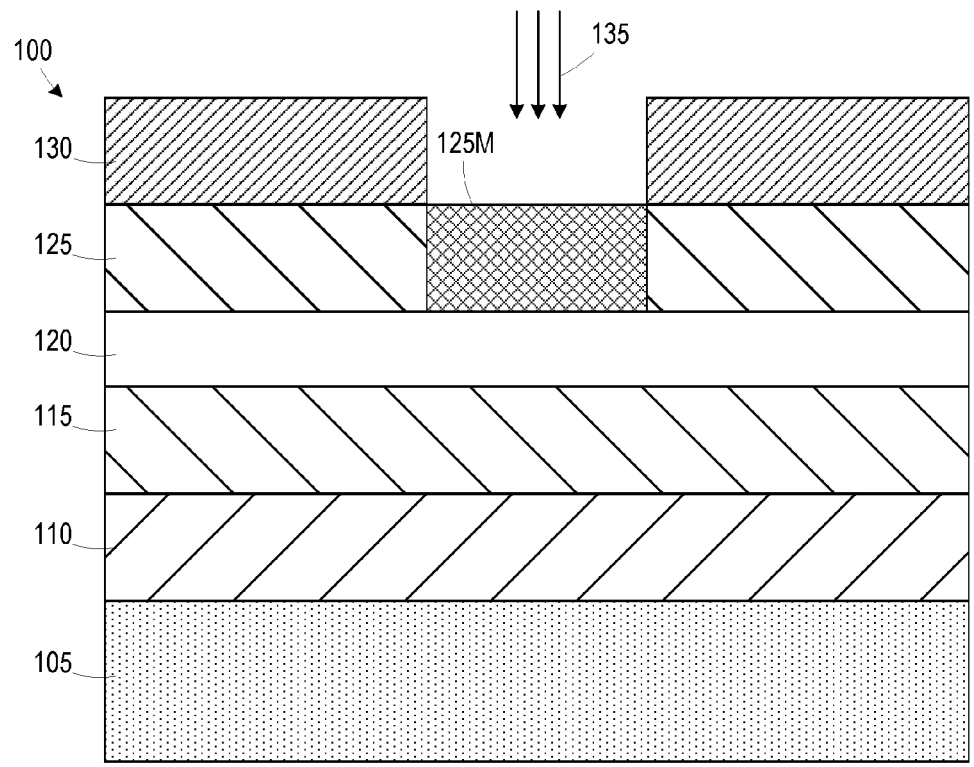

FIG. 1B illustrates the device 100 after an implantation process 135 was performed through the patterned mask layer 130 to define an implant region 125M in the mandrel layer 125. In one embodiment, the mandrel layer 125 may be implanted with a dopant such as boron to define the implant region 125M. In general, the implantation of a dopant into the mandrel layer 125 modifies the etch characteristics of the implant region 125M with respect to the remaining portions of the mandrel layer 125.

Figure 1C:
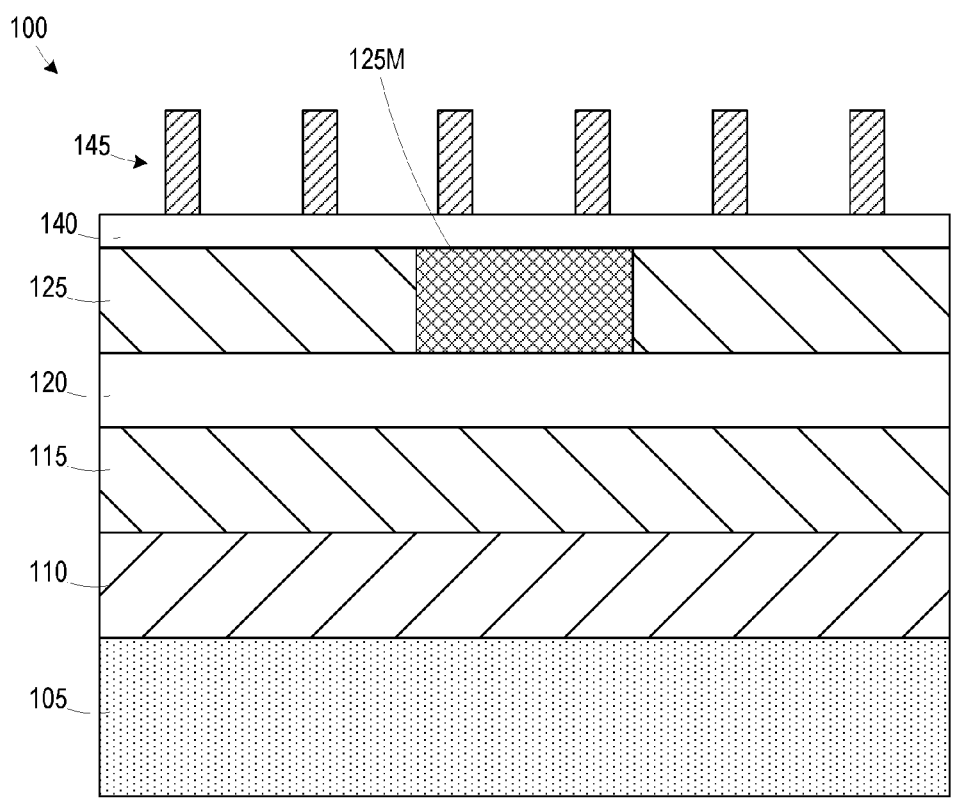

FIG. 1C illustrates the device 100 after several processes were performed. An etch or strip process was performed to remove the patterned mask layer 130. A deposition process was performed to form a second hard mask layer 140 above the mandrel layer 125. Several processes were performed to form a patterned mask layer 145 above the second hard mask layer 140 for patterning the mandrel layer 125.

Figure 1D:
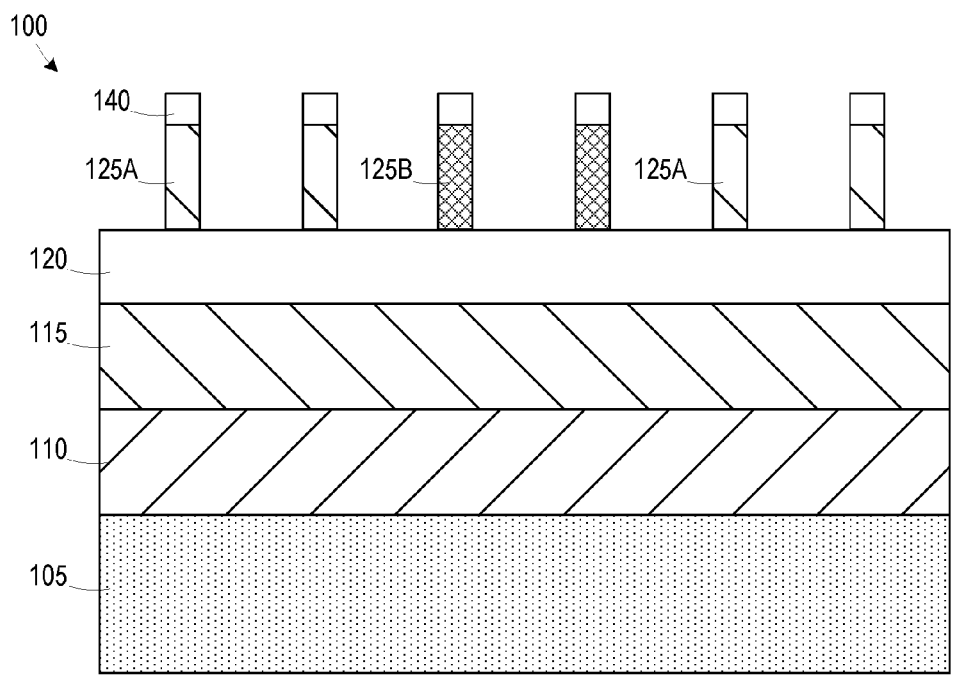

FIG. 1D illustrates the device 100 after several processes were performed. First, an etch process was performed through the patterned mask layer 145 to pattern the hard mask layer 140. Additional etch processes were performed to etch the mandrel layer 125 selectively to the hard mask layer 140 to define mandrel elements 125A, 125B from the mandrel layer 125. Portions of the patterned hard mask layer 140 remain on upper surfaces of the mandrel elements 125A, 125B. The mandrel elements 125B were formed from the implant region 125M, so they have different etch characteristics than the mandrel elements 125A. An etch or strip process may have been performed to remove the patterned mask layer 145, or the patterned mask layer 145 may have been be consumed during the etching of the mandrel layer 125.

Figure 1E:
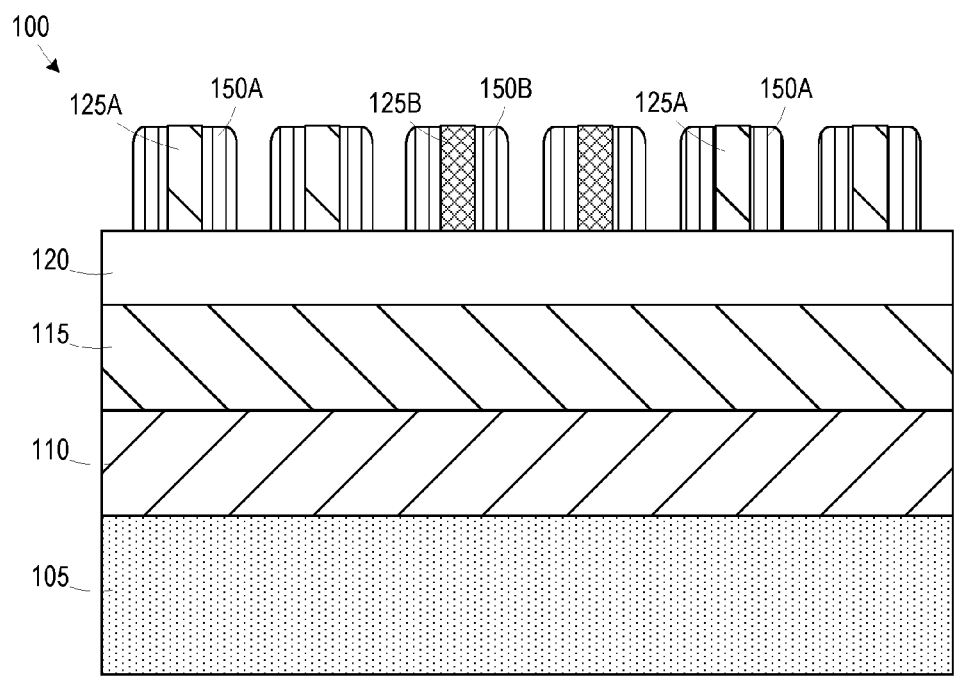

FIG. 1E illustrates the device 100 after several processes were performed. First, a spacer layer (e.g., silicon dioxide—not shown) was formed above the mandrel elements and the hard mask layer 120. Then an anisotropic etch process was performed to remove portions of the spacer layer formed on horizontal portions of the hard mask layers 120, 140 to define spacers 150A, 150B on sidewalls of the mandrel elements 125A, 125B, respectively. The remaining portions of the hard mask layer 140 may be removed by tuning the etch chemistry during the spacer etch or by a subsequent etch process.

Figure 1F:
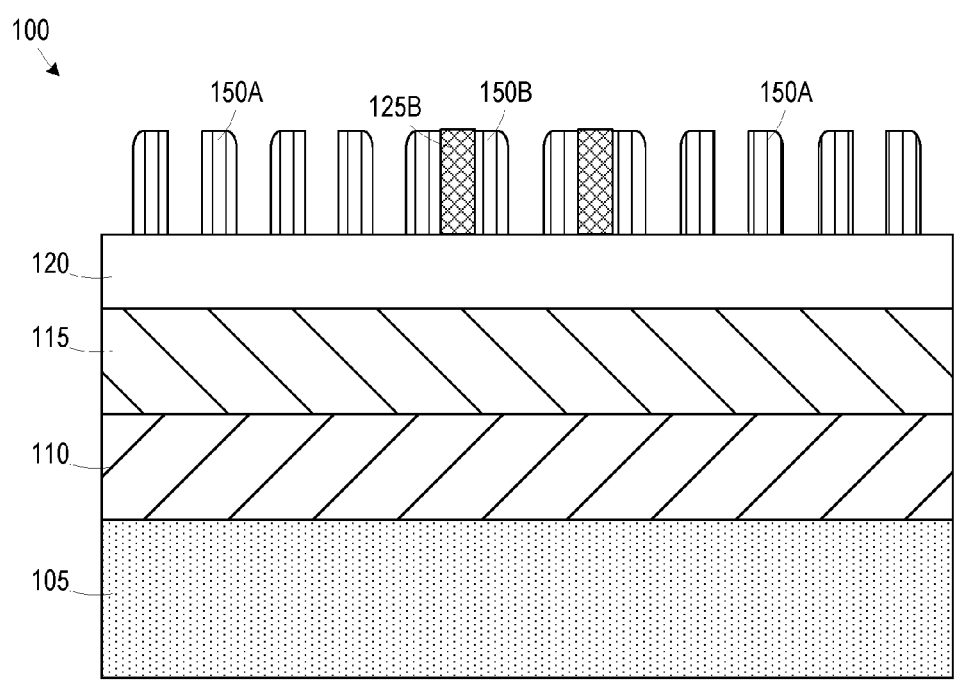

FIG. 1F illustrates the device 100 after an etch process was performed to remove the mandrel elements 125A selectively to the mandrel elements 125B. Because of the presence of the implanted dopant in the mandrel elements 125B, the mandrel elements 125A may be selectively removed. The spacers 150A define narrow mask elements, and the combined mandrel element 125B/spacer 150B structures define wide mask elements.

Figure 1G:
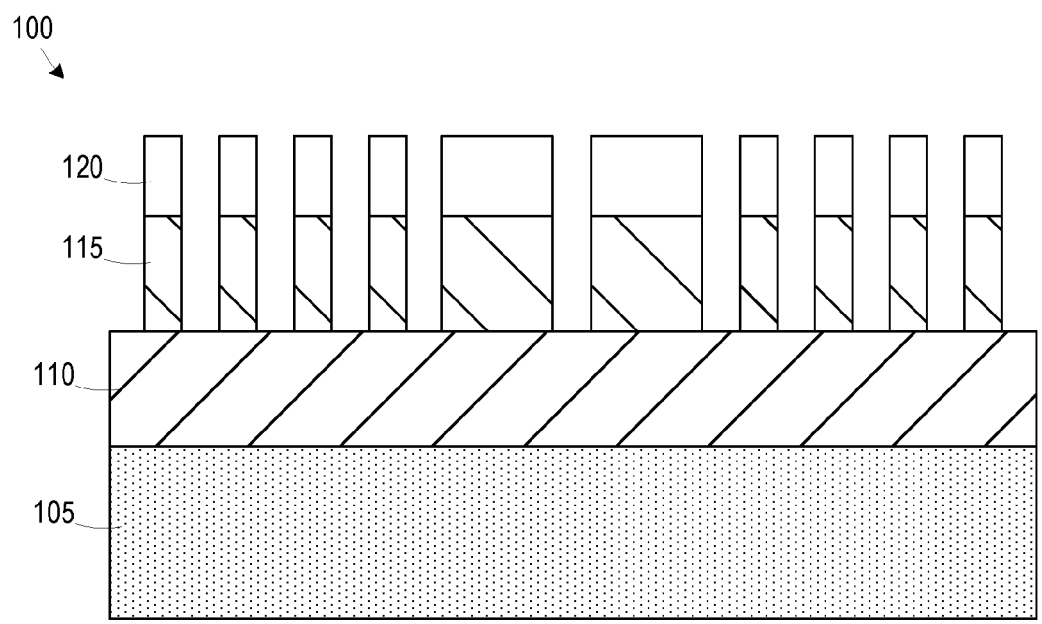

FIG. 1G illustrates the device 100 after several etch processes were performed. First, an etch process was performed through the spacers 150A and the combined structures formed by the spacers 150B and the mandrel elements 125B to pattern the hard mask layer 120. One or more etch processes were performed to remove the spacers 150A, 150B, and the mandrel elements 150B. Next, an etch process was performed through the patterned hard mask layer 120 to etch the gate material layer 115.

Figure 1H:
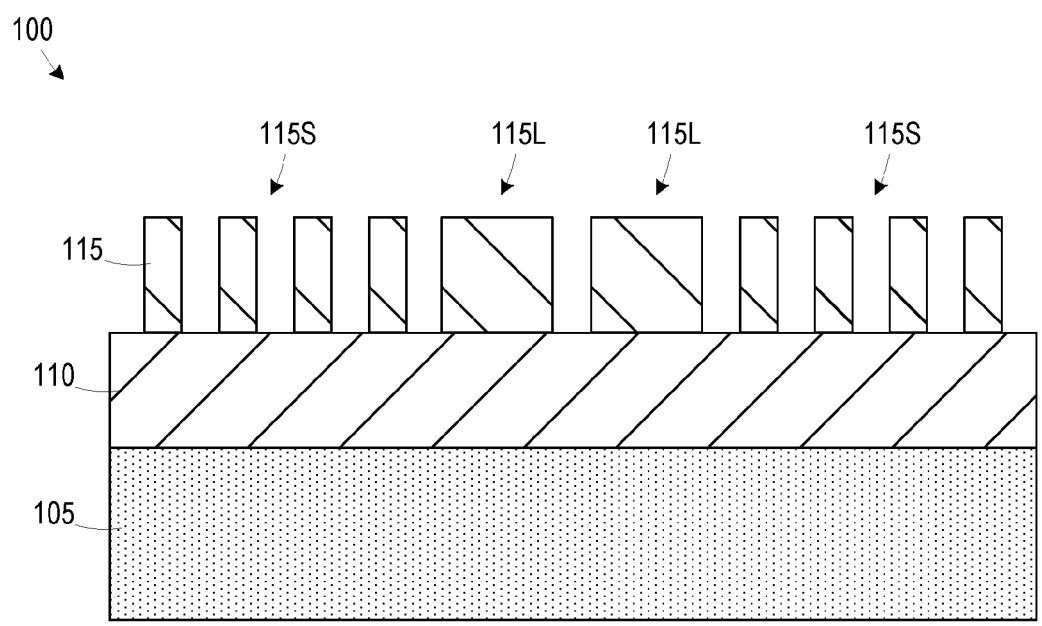

FIG. 1H illustrates the device 100 after an etch process was performed to remove the hard mask layer 120. The device includes short channel gate structures 115S and long channel gate structures 115L. Hence, narrow and wide patterns may be formed using the same photolithography and self-aligned processes. Although an extra mask process is required to form the implant region 125M in FIG. 1B, the photolithography constraints for doing so are not significant and do not give rise to the alignment and pitch walking defects described above.

FIGS. 1A-1H illustrate a self-aligned double patterning (SADP) scheme. The techniques may also be employed with a self-aligned quadrature (SAQP) process which employs two mandrel layers. The modification of the mandrel etch selectivity may be performed on the upper mandrel layer, the lower mandrel layer, or both mandrel layers, as illustrated below.

Figure 2A:
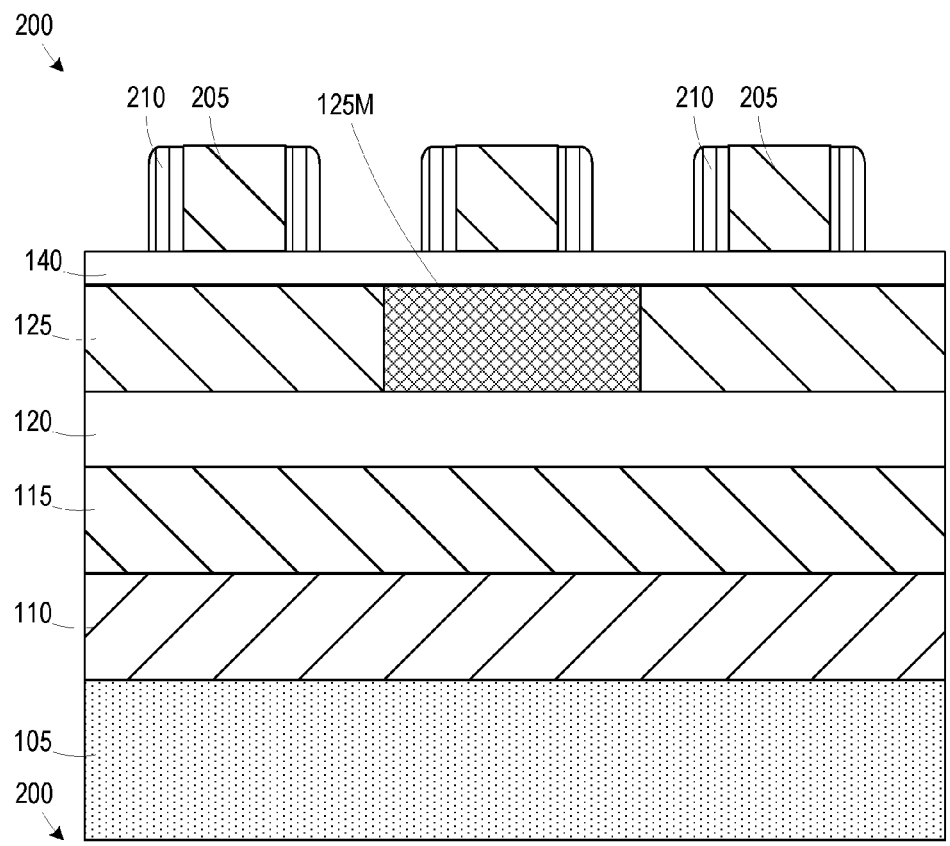
FIGS. 2A-2B are cross-sectional diagrams illustrating patterning of a process layer in a self-aligned quadruple patterning process using a sidewall image template with a modified lower mandrel.
Figure 2B:
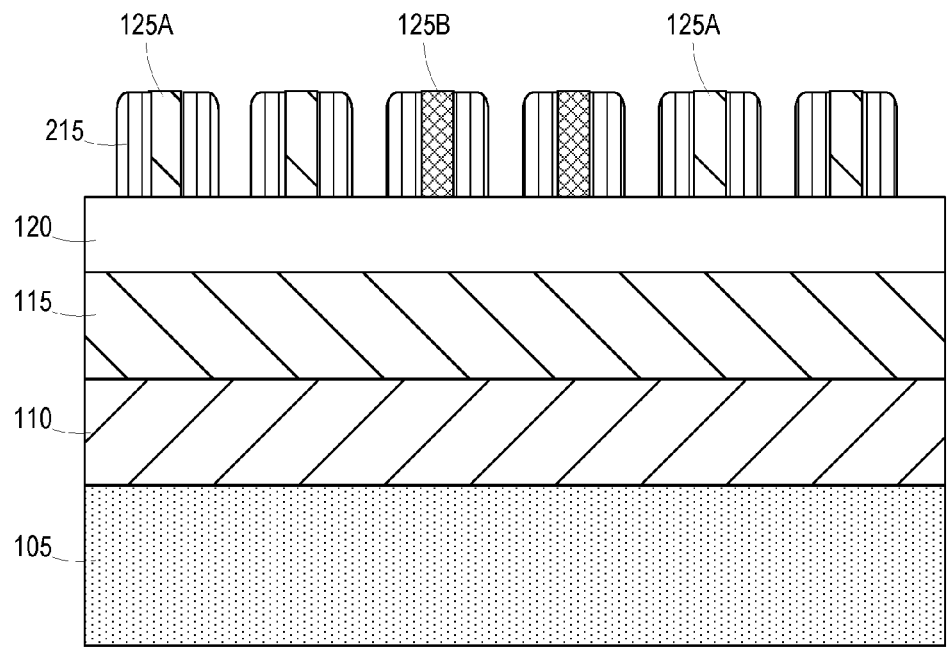

FIGS. 2A-2B illustrate a device 200 where the modification of the mandrel etch selectivity is performed on the lower mandrel layer. In FIG. 2A, the mandrel layer 125 is a lower mandrel layer. Starting with a structure similar to that illustrated in FIG. 1C, an upper mandrel layer was formed above the hard mask layer 140 and patterned to define upper mandrel elements 205. A spacer layer was formed and etched to define spacers 210 adjacent the upper mandrel elements 205.

FIG. 2B illustrates the device after several processes were performed to transfer the pattern defined by the spacers 210 to the mandrel layer 125. An etch process was performed to remove the mandrel elements 205. An etch process was performed through the spacers 210 to pattern the hard mask layer 140. One or more etch processes were performed to remove the spacers 210. An etch process was performed through the patterned hard mask layer 140 to pattern the mandrel layer 125, defining mandrel elements 125A, 125B from the mandrel layer 125. Again, since the mandrel elements 125B were formed from the implant region 125M, so they have different etch characteristics than the mandrel elements 125A. A spacer layer (e.g., silicon dioxide—not shown) was formed above the mandrel elements 125A, 125B and the hard mask layer 120. Then an anisotropic etch process was performed to remove portions of the spacer layer formed on horizontal portions of the hard mask layer 140 to define spacers 215 on sidewalls of the mandrel elements 125A, 125B, respectively. Processing may continue as described in FIGS. 1G and 1H to complete the patterning of the gate material layer 115.

Figure 3A:
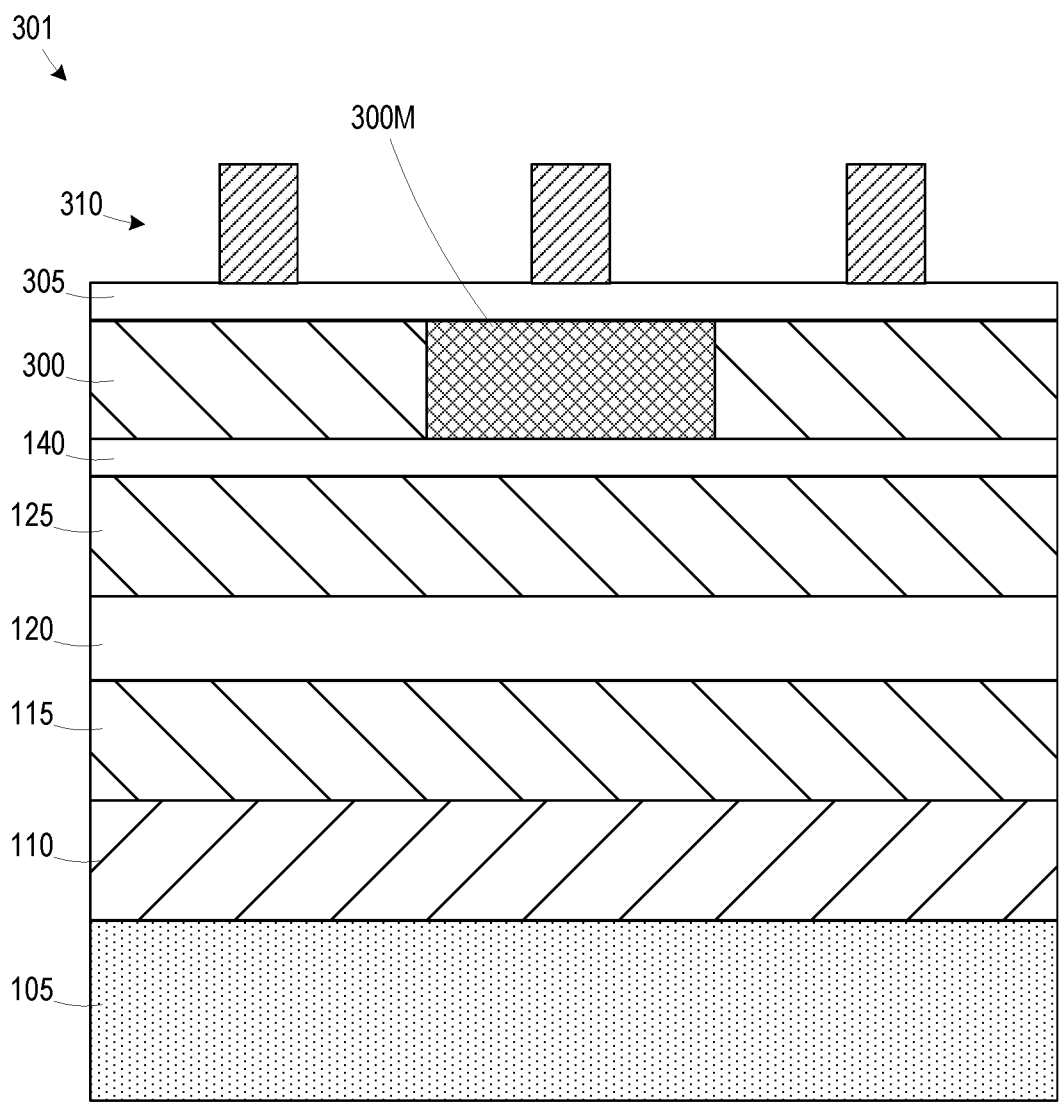
FIGS. 3A-3G are cross-sectional diagrams illustrating patterning of a process layer in a self-aligned quadruple patterning process using a sidewall image template with a modified upper mandrel.

FIGS. 3A-3G illustrate a device 301 where the modification of the mandrel etch selectivity is performed on the upper mandrel layer. In FIG. 3A, the mandrel layer 125 is a lower mandrel layer. An upper mandrel layer 300 was formed above the hard mask layer 140, the upper mandrel layer 300 was implanted using a patterned mask (i.e., similar to the process shown in FIG. 1B) to define an implant region 300M, a hard mask layer 305 was formed above the upper mandrel layer 300, and a patterned mask layer 310 was formed above the hard mask layer 305.

Figure 3B:
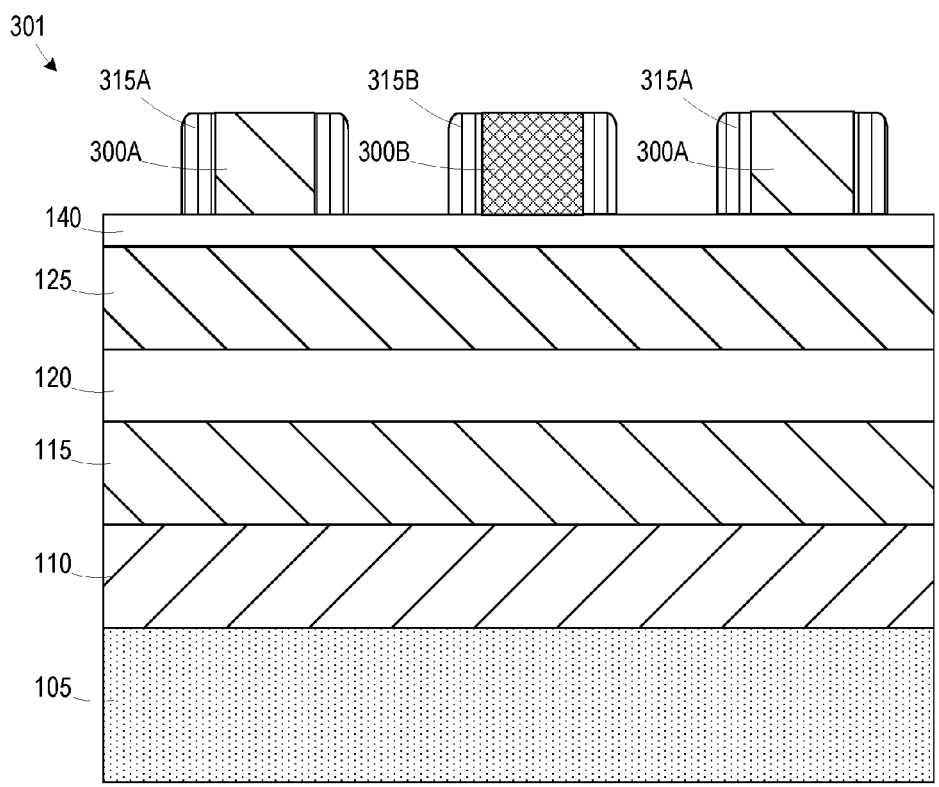

FIG. 3B illustrates the device 301 after several processes were performed. First, an etch process was performed through the patterned mask layer 310 to pattern the hard mask layer 305. Additional etch processes were performed to etch the upper mandrel layer 300 selectively to the hard mask layer 305 to define mandrel elements 300A, 300B from the mandrel layer 300. The mandrel element 300B was formed from the implant region 300M, so it has different etch characteristics than the mandrel elements 300A. An etch or strip process may have been performed to remove the patterned mask layer 310, or the patterned mask layer 310 may have been consumed during the etching of mandrel layer 300. A spacer layer (e.g., silicon dioxide—not shown) was formed above the mandrel elements 300A, 300B and an anisotropic etch process was performed to remove portions of the spacer layer formed on horizontal portions of the hard mask layer 140 to define spacers 315A, 315B on sidewalls of the mandrel elements 300A, 300B, respectively. The remaining portions of the hard mask layer 305 may be removed by tuning the etch chemistry during the spacer etch or by a subsequent etch process.

Figure 3C:
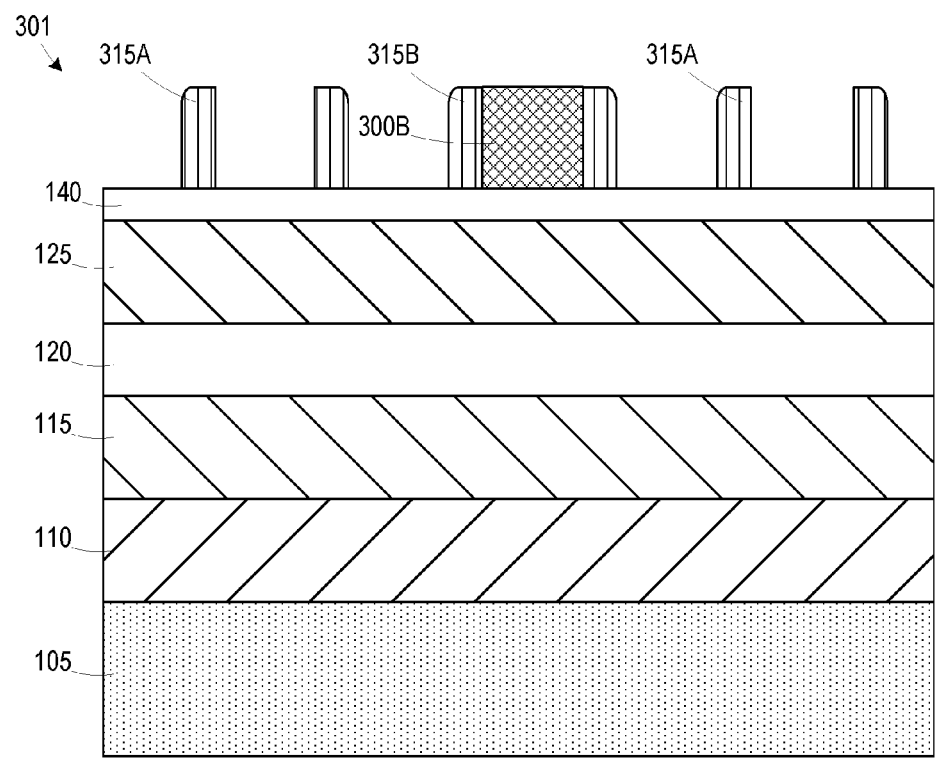

FIG. 3C illustrates the device 301 after an etch process was performed to remove the mandrel elements 300A selectively to the mandrel elements 300B. Because of the presence of the implanted dopant in the mandrel elements 300B, the mandrel elements 300A may be selectively removed. The spacers 315A define narrow mask elements, and the combined mandrel element 300B/spacer 315B structures define wide mask elements.

Figure 3D:
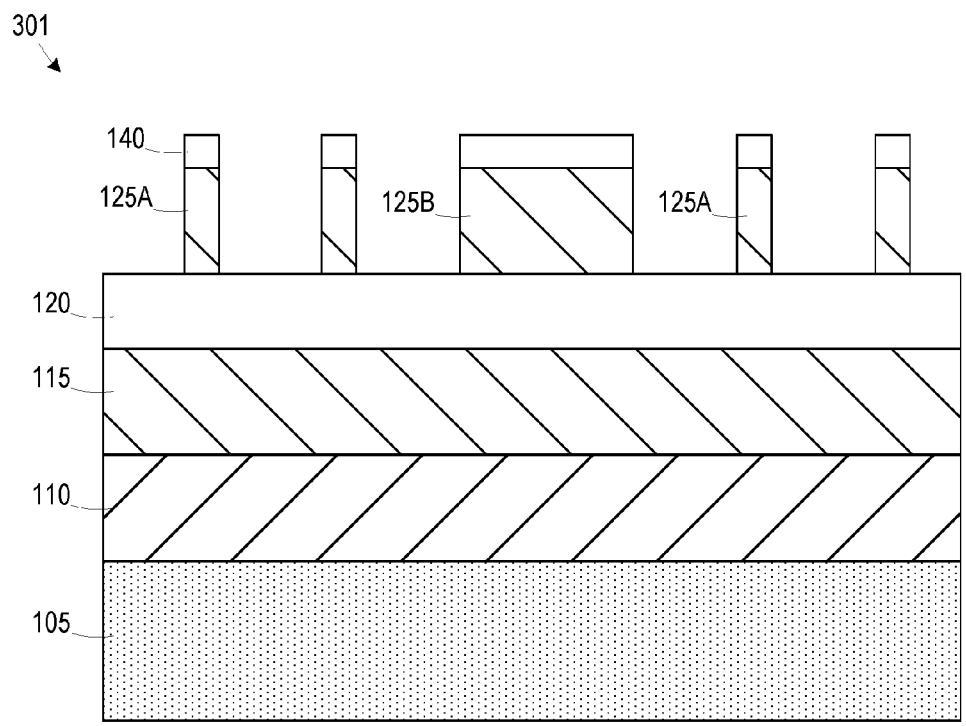

FIG. 3D illustrates the device 301 after several etch processes were performed. First, an etch process was performed through the spacers 315A and the combined structures formed by the spacers 315B and the mandrel element 300B to pattern the hard mask layer 140. One or more etch processes were performed to remove the spacers 315A, 315B, and the mandrel element 300B. Next, an etch process was performed through the patterned hard mask layer 140 to etch the lower mandrel layer 125 to define narrow mandrel elements 125A and a wide mandrel element 125B.

Figure 3E:
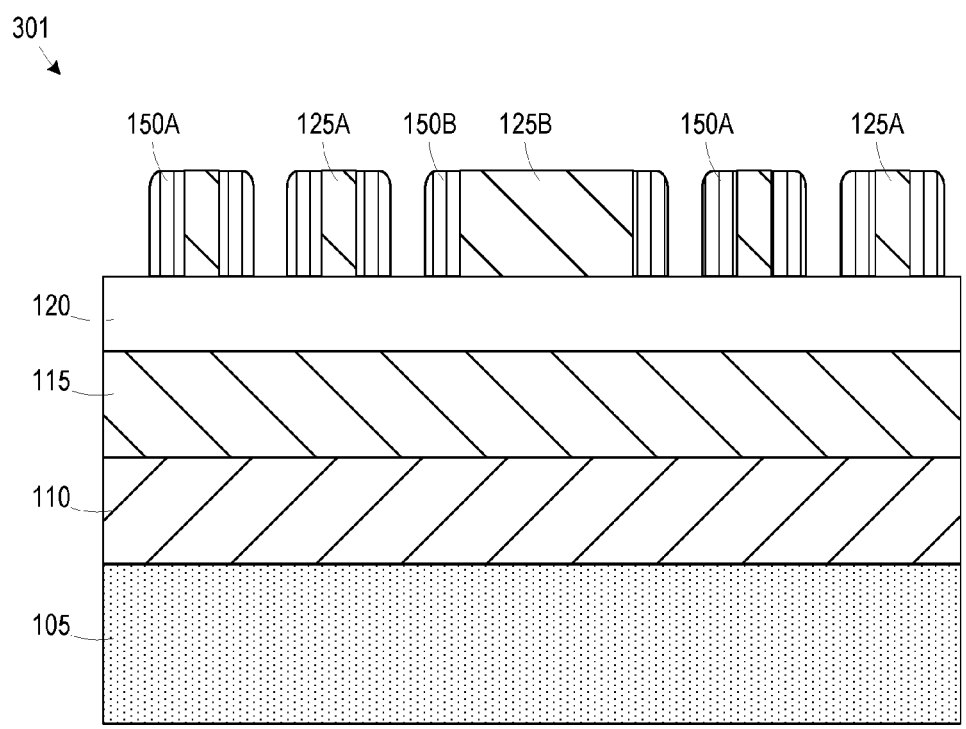

FIG. 3E illustrates the device 301 after several processes were performed. First, a spacer layer (e.g., silicon dioxide—not shown) was formed above the mandrel elements and the hard mask layer 120. Then an anisotropic etch process was performed to remove portions of the spacer layer formed on horizontal portions of the hard mask layers 120, 140 to define spacers 150A, 150B on sidewalls of the mandrel elements 125A, 125B, respectively. The remaining portions of the hard mask layer 140 may be removed by tuning the etch chemistry during the spacer etch or by a subsequent etch process.

Figure 3F:
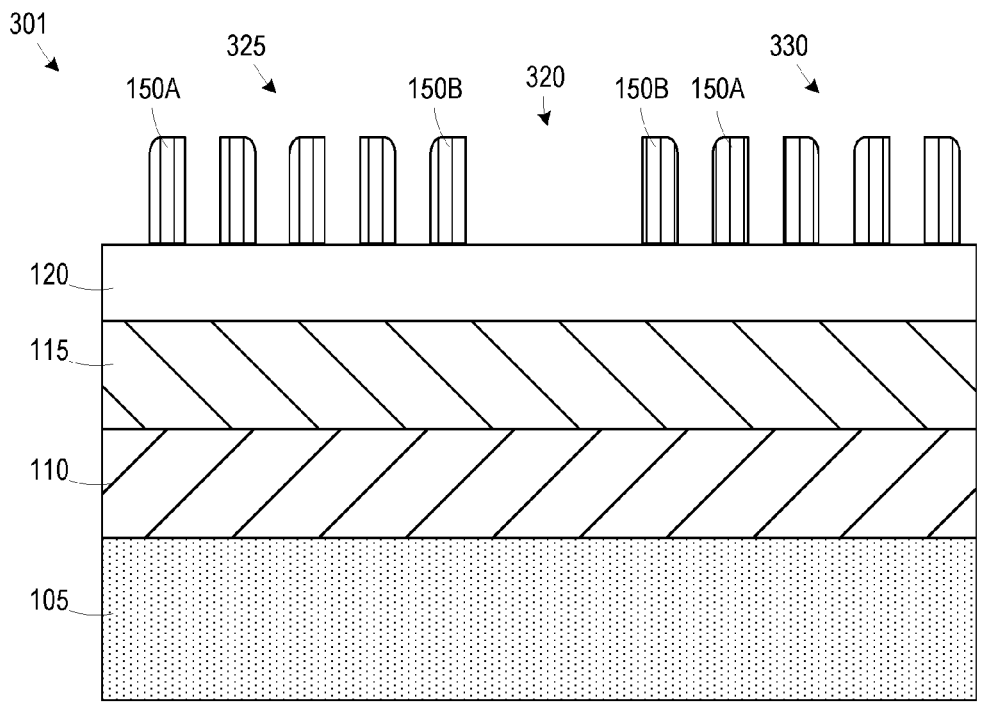

FIG. 3F illustrates the device 301 after an etch process was performed to remove the mandrel elements 125A, 125B. Because the implanted dopant was not present in the mandrel element 125B, all the mandrel elements 125A, 125B were removed. The spacers 150A, 150B define narrow mask elements, and the region that was occupied by the mandrel element 125B defines a space 320 between first and second sets 325, 330 of mandrel elements. The self-aligned process for defining the spacers 150A, 150B allows the space 320 to be defined without any additional masking or photolithography.

Figure 3G:
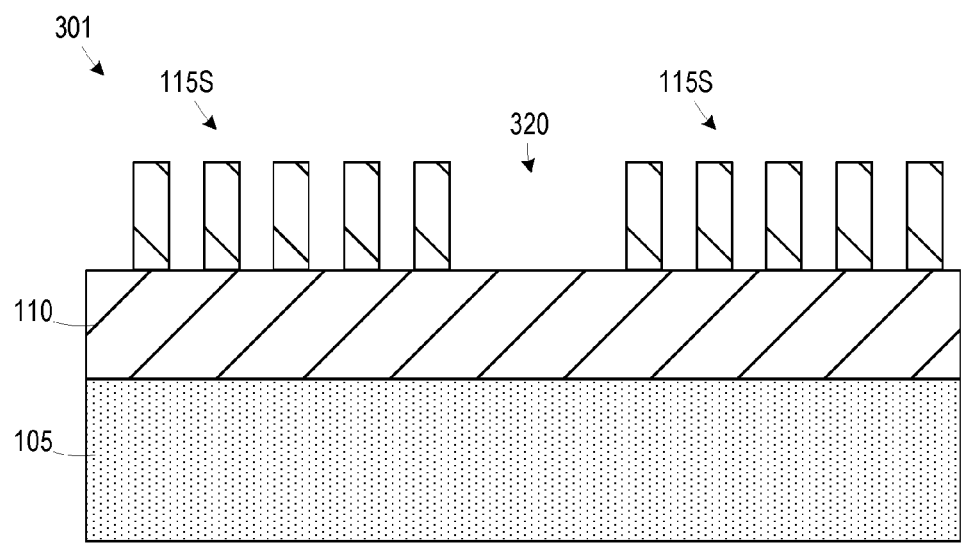

FIG. 3G illustrates the device 301 after several processes were performed to transfer the pattern defined by the spacers 150A, 150B to the gate material layer 115. An etch process was performed through the spacers 150A, 150B to pattern the hard mask layer 120. One or more etch processes were performed to remove the spacers 150A, 150B. An etch process was performed through the patterned hard mask layer 120 to pattern the gate material layer 115, defining short channel gate structures 115S separated by the space 320. An etch process was performed to remove the patterned hard mask layer 120.

Figure 4A:
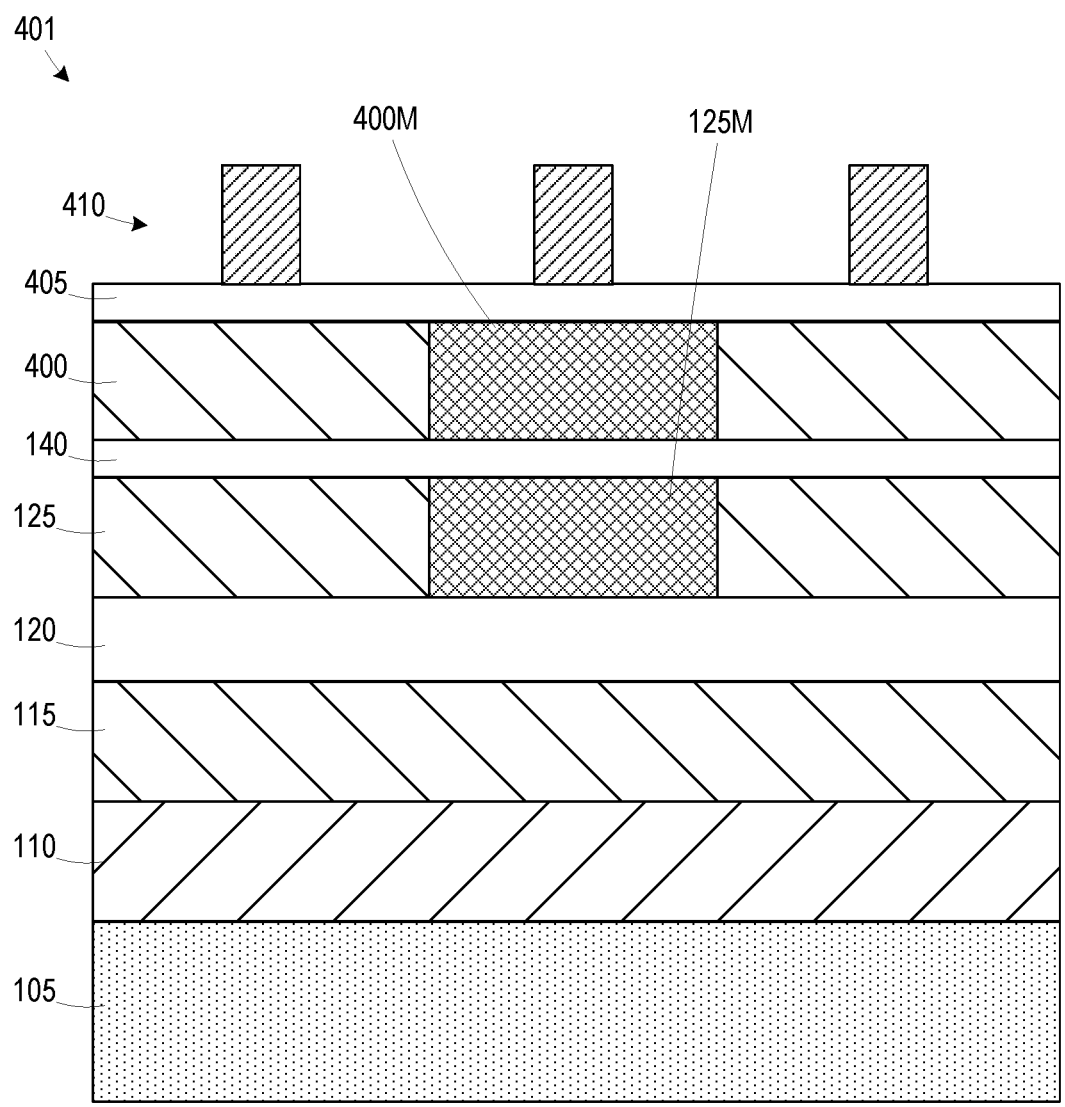
FIGS. 4A-4G are cross-sectional diagrams illustrating patterning of a process layer in a self-aligned quadruple patterning process using a sidewall image template with modified upper and lower mandrels.

FIGS. 4A-4G illustrate a device 401 where the modification of the mandrel etch selectivity is performed on both mandrel layers. In FIG. 4A, the mandrel layer 125 is a lower mandrel layer. An upper mandrel layer 400 was formed above the hard mask layer 140. The lower mandrel layer 125 was implanted using a patterned mask (i.e., similar to the process shown in FIG. 1B) to define an implant region 125M and the upper mandrel layer 400 was implanted to define an implant region 400M. The implant regions 125M, 400M may be formed concurrently, or the implant region 125M may be formed prior to forming the hard mask layer 140 and the upper mandrel layer 400. A hard mask layer 405 was formed above the upper mandrel layer 400, and a patterned mask layer 410 was formed above the hard mask layer 405. In FIG. 4A, the implant regions 125M, 400M are vertically aligned and have the same width. In some embodiments, the first and second implant regions 125M, 400M may not be aligned, they may have different widths, and more than one implant region may be formed in the respective mandrel layers 125, 400.

Figure 4B:
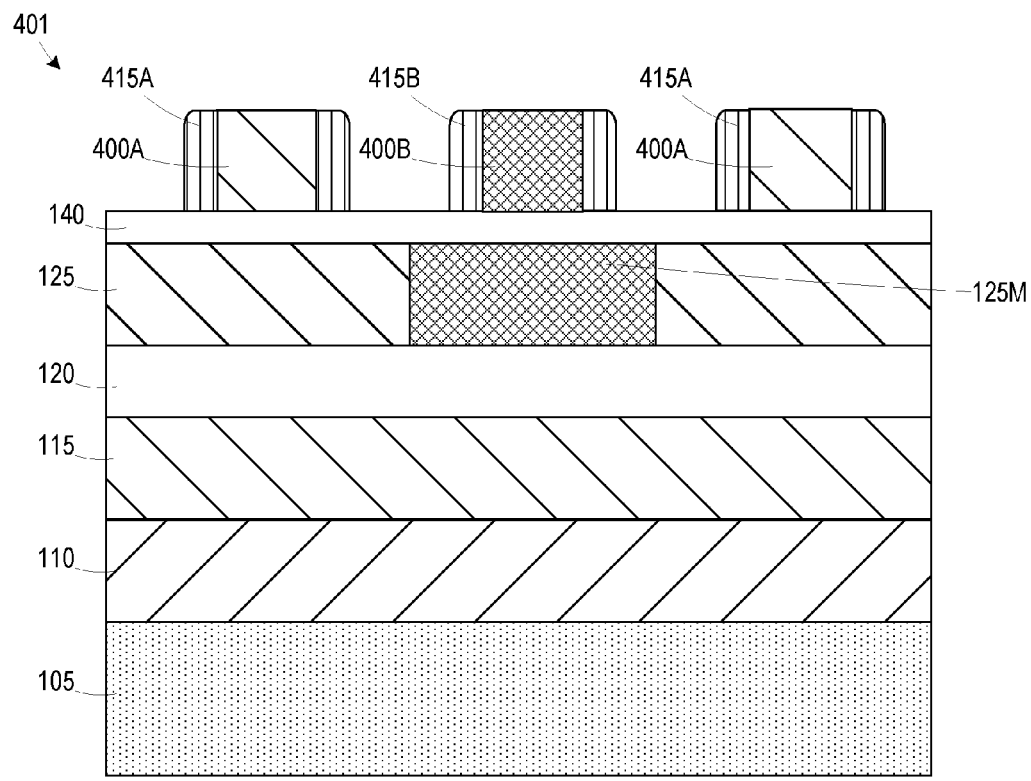

FIG. 4B illustrates the device 401 after several processes were performed. First, an etch process was performed through the patterned mask layer 410 to pattern the hard mask layer 405. Additional etch processes were performed to etch the upper mandrel layer 400 selectively to the hard mask layer 405 to define mandrel elements 400A, 400B from the mandrel layer 400. The mandrel element 400B was formed from the implant region 400M, so it has different etch characteristics than the mandrel elements 400A. An etch or strip process may have been performed to remove the patterned mask layer 410, or the patterned mask layer 410 may have been consumed during the etching of mandrel layer 400. A spacer layer (e.g., silicon dioxide—not shown) was formed above the mandrel elements 400A, 400B and an anisotropic etch process was performed to remove portions of the spacer layer formed on horizontal portions of the hard mask layer 140 to define spacers 415A, 415B on sidewalls of the mandrel elements 400A, 400B, respectively. The remaining portions of the hard mask layer 405 may be removed by tuning the etch chemistry during the spacer etch or by a subsequent etch process.

Figure 4C:
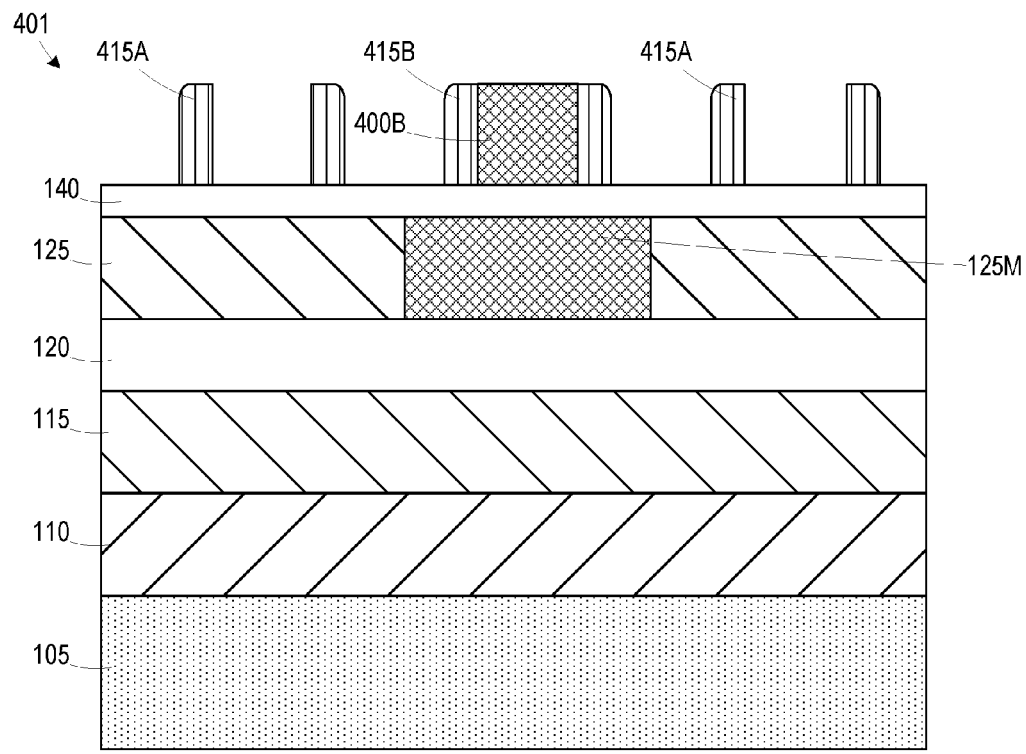

FIG. 4C illustrates the device 401 after an etch process was performed to remove the mandrel elements 400A selectively to the mandrel elements 400B. Because of the presence of the implanted dopant in the mandrel elements 400B, the mandrel elements 400A may be selectively removed. The spacers 415A define narrow mask elements, and the combined mandrel element 400B/spacer 415B structures define wide mask elements.

Figure 4D:
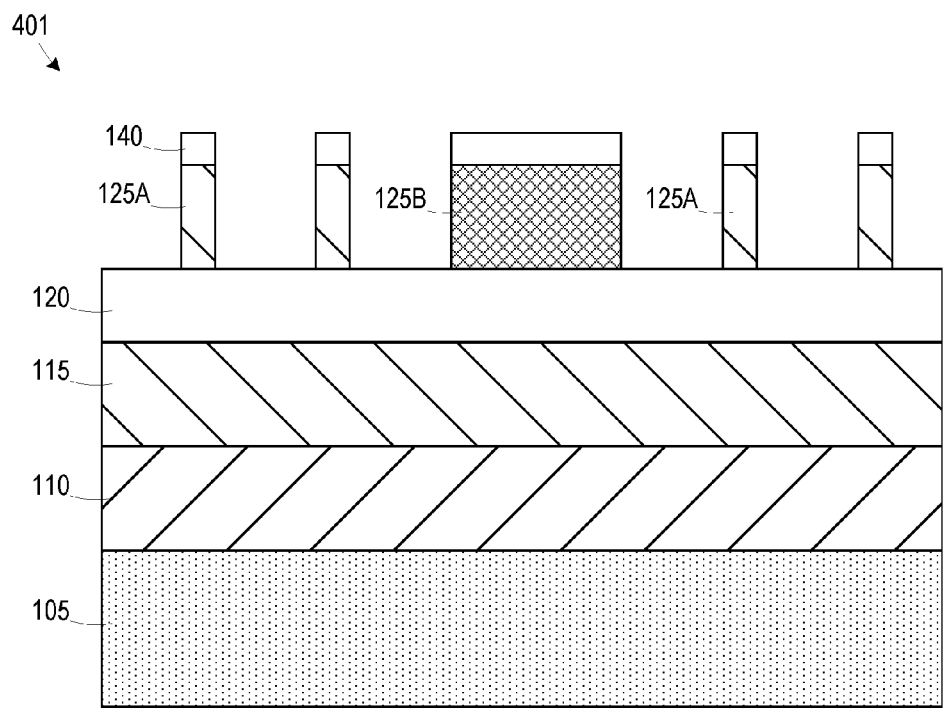

FIG. 4D illustrates the device 401 after several etch processes were performed. First, an etch process was performed through the spacers 415A and the combined structures formed by the spacers 415B and the mandrel element 400B to pattern the hard mask layer 140. One or more etch processes were performed to remove the spacers 415A, 415B, and the mandrel element 400B. Next, an etch process was performed through the patterned hard mask layer 140 to etch the lower mandrel layer 125 to define narrow mandrel elements 125A and a wide mandrel element 125B. Since the wide mandrel element 125B was formed from the implant region 125M, it has different etch characteristics than the mandrel elements 125A.

Figure 4E:
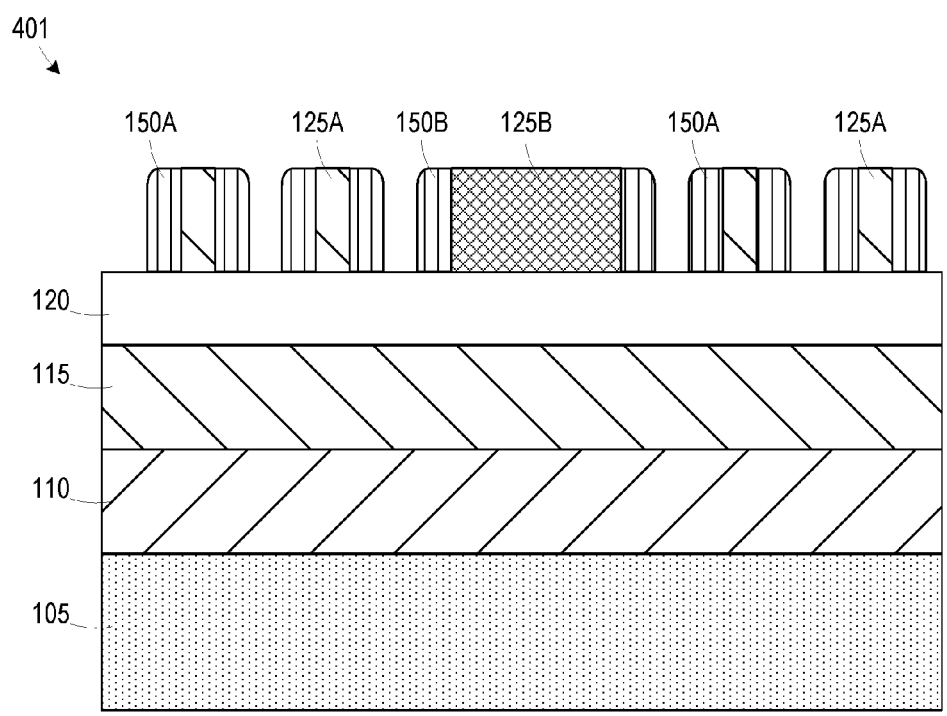

FIG. 4E illustrates the device 401 after several processes were performed. First, a spacer layer (e.g., silicon dioxide—not shown) was formed above the mandrel elements and the hard mask layer 120. Then an anisotropic etch process was performed to remove portions of the spacer layer formed on horizontal portions of the hard mask layers 120, 140 to define spacers 150A, 150B on sidewalls of the mandrel elements 125A, 125B, respectively. The remaining portions of the hard mask layer 140 may be removed by tuning the etch chemistry during the spacer etch or by a subsequent etch process.

Figure 4F:
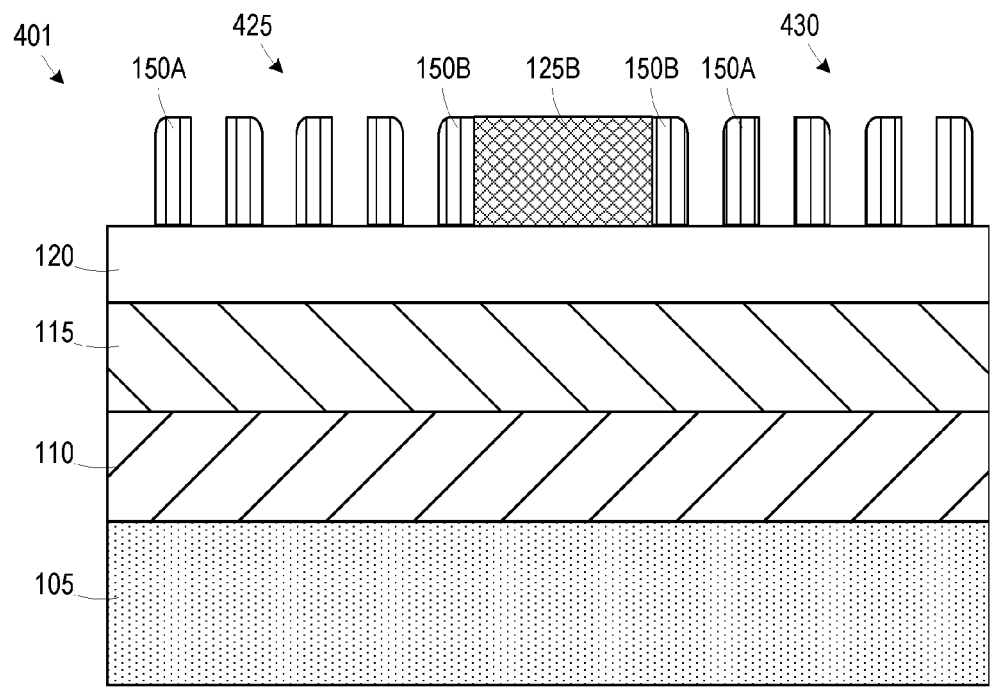

FIG. 4F illustrates the device 401 after an etch process was performed to remove the mandrel elements 125A selectively to the mandrel element 125B. The spacers 150A define narrow mask elements, and the combined mandrel element 125B/spacer 150B structure defines a wide mask element.

Figure 4G:
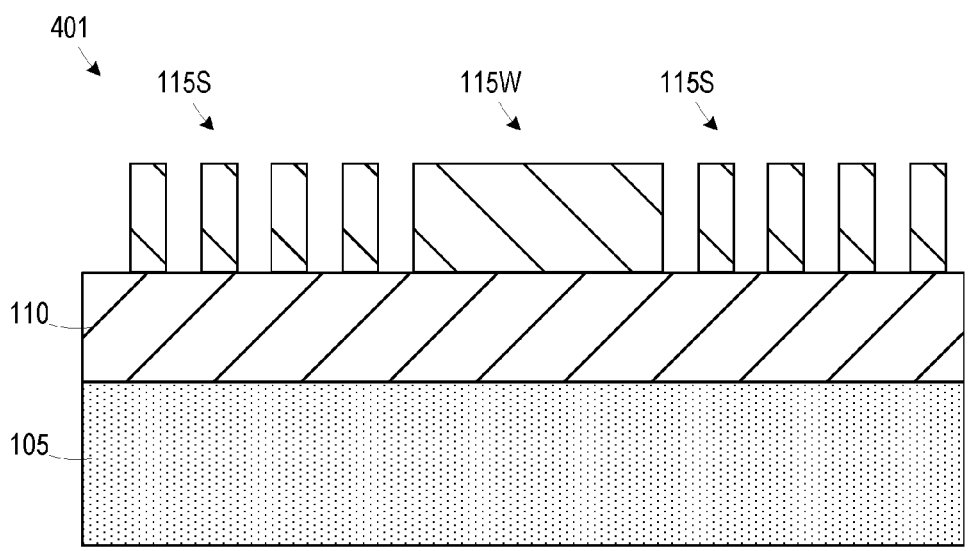

FIG. 4G illustrates the device 401 after several processes were performed to transfer the pattern defined by the spacers 150A, 150B and the mandrel element 125B to the gate material layer 115. An etch process was performed through the spacers 150A and the combined structure formed by the spacers 150B and the mandrel element 125B to pattern the hard mask layer 120. One or more etch processes were performed to remove the spacers 150A, 150B and the mandrel element 125B. An etch process was performed through the patterned hard mask layer 120 to pattern the gate material layer 115, defining short channel gate structures 115S and a long channel gate structure 115W.

The previous examples illustrate the patterning of a gate material layer. However, the application of these techniques is not limited to the patterning of a particular layer. For example, the patterned layer may be an insulating layer, and the masks may be used to form trenches in the dielectric layer for subsequently forming conductive interconnect features (e.g., BEOL patterning). The techniques described herein allow short channel and wide channel patterns to be formed using common lithography processes and self-aligned etch processes. These processes reduce the likelihood of defects arising from pitch walking misalignment, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi- fied and all such variations are considered within the scope and spirit of the invention. Accordingly, the protection sought herein is as set forth in the claims below.

What is claimed:

1. A method, comprising:
   forming a first mandrel layer above a first process layer;
   forming a first implant region in said first mandrel layer;
   patterning said first mandrel layer to define a plurality of first mandrel elements, wherein at least a first subset of said first mandrel elements is formed from said first mandrel layer outside said first implant region and a second subset of said first mandrel elements is formed from said first implant region;

forming first spacers on sidewalls of said plurality of first mandrel elements;
selectively removing said first subset of said first mandrel elements without removing said second subset of said first mandrel elements; and
patterning said first process layer using said first spacers and said second subset of said first mandrel elements as an etch mask.

2. The method of claim 1, wherein said first process layer comprises a gate material layer, and patterning said gate material layer comprises forming a first gate structure having a first critical dimension beneath one of said first spacers and forming a second gate structure having a second critical dimension larger than said first critical dimension beneath a combined structure defined by one of said second subset of said first mandrel elements and its associated first spacers.

3. The method of claim 1, further comprising forming a first hard mask layer between said first process layer and said first mandrel layer, wherein patterning said first process layer comprises performing a first etch process to transfer a pattern defined by said first spacers and said second subset of said first mandrel elements to said first hard mask layer to define a patterned first hard mask layer and performing a second etch process to etch said first process layer through said patterned first hard mask layer.

4. The method of claim 3, further comprising removing said first spacers and said second subset of said first mandrel elements prior to performing said second etch process.

5. The method of claim 1, wherein said first process layer comprises a second mandrel layer, and the method further comprises:
forming a second process layer beneath said second mandrel layer;
patterning said second mandrel layer using said first spacers and said second subset of said mandrel elements as an etch mask to define a second plurality of mandrel elements;
forming second spacers on sidewalls of said plurality of second mandrel elements;
removing said second mandrel elements; and
patterning said second process layer using said second spacers as an etch mask.

6. The method of claim 5, wherein said second process layer comprises a gate material layer, and patterning said gate material layer comprises forming gate structures having a first critical dimension beneath said second spacers, wherein a space is defined between first and second subsets of said gate structures, said space having a width corresponding to a width of one of said second subset of said mandrel elements.

7. The method of claim 5, further comprising forming a first hard mask layer between said second mandrel layer and said second process layer, wherein patterning said second process layer comprises performing a first etch process to transfer a pattern defined by said second spacers to said first hard mask layer to define a patterned first hard mask layer and performing a second etch process to etch said first process layer through said patterned first hard mask layer.

8. The method of claim 7, further comprising removing said second spacers prior to performing said second etch process.

9. The method of claim 1, wherein said first process layer comprises a second mandrel layer, and the method further comprises:
forming a second process layer beneath said second mandrel layer;
forming a second implant region in said second mandrel layer;
patterning said second mandrel layer using said first spacers and said second subset of said first mandrel elements as an etch mask to define a plurality of second mandrel elements, wherein at least a first subset of said second mandrel elements is formed from said second mandrel layer outside said second implant region and a second subset of said second mandrel elements is formed from said second implant region;
forming second spacers on sidewalls of said plurality of second mandrel elements;
selectively removing said first subset of said second mandrel elements without removing said second subset of said second mandrel elements; and
patterning said second process layer using said second spacers and said second subset of said second mandrel elements as an etch mask.

10. The method of claim 9, wherein said second process layer comprises a gate material layer, and patterning said gate material layer comprises forming gate structures having a first critical dimension beneath said second spacers and forming a second gate structure having a second critical dimension larger than said first critical dimension beneath a combined structure defined by one of said second subset of said second mandrel elements and its associated second spacers.

11. The method of claim 9, further comprising forming a first hard mask layer between said second mandrel layer and said second process layer, wherein patterning said second process layer comprises performing a first etch process to transfer a pattern defined by said second spacers and said second subset of said second mandrel elements to said first hard mask layer to define a patterned first hard mask layer and performing a second etch process to etch said first process layer through said patterned first hard mask layer.

12. The method of claim 11, further comprising removing said second spacers and said second subset of said second mandrel elements prior to performing said second etch process.

13. The method of claim 9, wherein forming said first and second implant regions comprises implanting boron into said first and second mandrel layers.

14. The method of claim 13, wherein said first and second implant regions are formed concurrently.

15. The method of claim 13, wherein said first and second implant regions are vertically aligned.

16. The method of claim 1, wherein forming said first implant region comprises implanting boron into said first mandrel layer.

17. A method, comprising:
forming a lower mandrel layer above a process layer;
forming a lower implant region in said lower mandrel layer;
forming an upper mandrel layer above said lower mandrel layer;
forming an upper implant region in said upper mandrel layer;
patterning said upper mandrel layer to define a plurality of first mandrel elements, wherein at least a first subset of said first mandrel elements is formed from said upper mandrel layer outside said upper implant region and a second subset of said upper mandrel elements is formed from said upper implant region;
forming first spacers on sidewalls of said plurality of upper mandrel elements;

selectively removing said first subset of said upper mandrel elements without removing said second subset of said upper mandrel elements;

patterning said lower mandrel layer using said first spacers and said second subset of said upper mandrel elements as an etch mask to define a plurality of lower mandrel elements, wherein at least a first subset of said lower mandrel elements is formed from said lower mandrel layer outside said lower implant region and a second subset of said lower mandrel elements is formed from said lower implant region;

forming second spacers on sidewalls of said plurality of lower mandrel elements;

selectively removing said first subset of said lower mandrel elements without removing said second subset of said lower mandrel elements; and patterning said process layer using said second spacers and said second subset of said lower mandrel elements as an etch mask.

18. The method of claim 17, wherein patterning said process layer comprises forming gate structures having a first critical dimension beneath said second spacers and forming a second gate structure having a second critical dimension larger than said first critical dimension beneath a combined structure defined by one of said second subset of said lower mandrel elements and its associated second spacers.

19. The method of claim 17, wherein forming said upper and lower implant regions comprises implanting boron into said upper and lower mandrel layers.

20. The method of claim 17, wherein said upper and lower implant regions are vertically aligned.

* * * * *